United States Patent
Fukuzawa

(10) Patent No.: US 10,084,459 B2
(45) Date of Patent: Sep. 25, 2018

(54) OSCILLATOR, ELECTRONIC APPARATUS, AND MOVING OBJECT

(71) Applicant: Seiko Epson Corporation, Tokyo (JP)

(72) Inventor: Akihiro Fukuzawa, Hino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/605,267

(22) Filed: May 25, 2017

(65) Prior Publication Data

US 2017/0264301 A1    Sep. 14, 2017

Related U.S. Application Data

(63) Continuation of application No. 14/994,372, filed on Jan. 13, 2016, now Pat. No. 9,692,425.

(30) Foreign Application Priority Data

Jan. 19, 2015 (JP) ................. 2015-007933

(51) Int. Cl.
*H03L 1/00* (2006.01)

(52) U.S. Cl.
CPC ..................... *H03L 1/00* (2013.01)

(58) Field of Classification Search
CPC ........................................ H03L 1/00
USPC ........................................... 331/66
See application file for complete search history.

(56) References Cited

U.S. PATENT DOCUMENTS

| 5,801,594 A | 9/1998 | Muto et al. |
| 2004/0257254 A1 | 12/2004 | Jiang et al. |

FOREIGN PATENT DOCUMENTS

JP    64-082809 A    3/1989

*Primary Examiner* — Joseph Chang
(74) *Attorney, Agent, or Firm* — Harness, Dickey & Pierce, P.L.C.

(57) ABSTRACT

An oscillator includes a control voltage generator that generates a control voltage between a first reference voltage and a second reference voltage with a digital signal, and a voltage controlled oscillation circuit that outputs a signal at a frequency in response to the control voltage. The control voltage generator includes a first D/A conversion circuit of resistor voltage-dividing type that generates a voltage between the first reference voltage and the second reference voltage.

15 Claims, 10 Drawing Sheets

OSCILLATOR, ELECTRONIC APPARATUS, AND MOVING OBJECT

CROSS-REFERENCE TO RELATED APPLICATIONS

This application is a continuation of U.S. patent application Ser. No. 14/994,372, filed Jan. 13, 2016, which claims priority to Japanese Patent Application No. 2015-007933, filed Jan. 19, 2015, the disclosures of which are hereby expressly incorporated by reference herein in their entireties.

BACKGROUND

1. Technical Field

The present invention relates to an oscillator, an electronic apparatus, and a moving object.

2. Related Art

JP-A-1-82809 discloses that in a digitally temperature compensated crystal oscillator, a circuit configuration can be simplified by generating a temperature compensated voltage with an R-2R type D/A converter.

In the digitally controlled oscillator whose oscillation frequency is controlled by a control signal that is obtained by subjecting a digital signal to D/A conversion as disclosed in JP-A-1-82809, noise that is generated when a changeover switch included in an R-2R type resistor ladder is switched in response to the digital signal is a problem. Since the changeover switch is disposed on a current path from a reference voltage, a current that flows into a resistor group rapidly changes at the time of switching the changeover switch. Therefore, the noise is difficult to reject by a regulator or a small-capacity capacitor, and flows out to a common power supply with an oscillation circuit, causing a problem of degrading noise characteristics of an oscillator output. Moreover, D/A converters, such as those of the resistor ladder type other than the R-2R type, the pulse-width modulation (PWM) type, the delta-sigma type, and the capacitor array type, suffer from a similar problem.

Noise that is superimposed on a control signal can be reduced by a low-pass filter or the like. However, in order to sufficiently reduce noise that is generated in a power supply, a large capacitor or the like has to be mounted, which may fail to meet the need for miniaturization of an oscillator. Especially when a high-resolution digitally controlled oscillator with a digital signal of 12 bits or more is realized, the noise generated due to a rapid change in the current flowing into the resistor group at the time of switching of the changeover switch is a serious problem.

SUMMARY

An advantage of some aspects of the invention is to provide a digitally controlled oscillator capable of reducing noise that is superimposed on an output signal. Another advantage of some aspects of the invention is to provide an electronic apparatus and a moving object both using the oscillator.

The invention can be implemented as the following forms or application examples.

APPLICATION EXAMPLE 1

An oscillator according to this application example includes: a control voltage generator that generates a control voltage between a first reference voltage and a second reference voltage with a digital signal; and a voltage controlled oscillation circuit that outputs a signal at a frequency in response to the control voltage, wherein the control voltage generator includes a first D/A conversion circuit of resistor voltage-dividing type that generates a voltage between the first reference voltage and the second reference voltage.

According to the oscillator according to the application example, the first D/A conversion circuit is of the resistor voltage-dividing type, and therefore, an active element whose operation changes in response to the digital signal, such as a switch (a MOS transistor or a bipolar transistor), is not disposed between the first reference voltage and the second reference voltage. Therefore, even when the turning on/off of a switch group included in the first D/A conversion circuit is dynamically switched, a current that flows into the resistor group changes little. Accordingly, according to the application example, since current peak noise that is generated when the digital signal changes is small, it is possible to reduce noise that is superimposed on an output signal due to the propagation of the noise from the control voltage generator via a power supply node to the voltage controlled oscillation circuit.

APPLICATION EXAMPLE 2

The oscillator according to the application example may include a second D/A conversion circuit that generates the control voltage from the voltage generated by the first D/A conversion circuit.

APPLICATION EXAMPLE 3

In the oscillator according to the application example, the second D/A conversion circuit may be of the resistor voltage-dividing type.

According to this application example, it is possible to reduce noise that propagates from the second D/A conversion circuit to the voltage controlled oscillation circuit via a supply line of the first reference voltage or a supply line of the second reference voltage.

APPLICATION EXAMPLE 4

The oscillator according to the application example may include an operational amplifier that receives the voltage generated by the first D/A conversion circuit and outputs the voltage to the second D/A conversion circuit.

According to this application example, since the first D/A conversion circuit and the second D/A conversion circuit are separated by the operational amplifier, noise that is generated in the second D/A conversion circuit is less likely to propagate to the supply line of the first reference voltage or the supply line of the second reference voltage via the first D/A conversion circuit. Accordingly, for example, the second D/A conversion circuit can be composed of a D/A conversion circuit of any type. For example, when the second D/A conversion circuit is composed of a small-scale D/A conversion circuit, such as that of the R-2R type, there is an advantage in terms of the miniaturization of the oscillator.

APPLICATION EXAMPLE 5

In the oscillator according to the application example, the number of bits of the digital signal may be 12 or more.

APPLICATION EXAMPLE 6

The oscillator according to the application example may include a thermosensor, and the digital signal may be a signal based on a signal output from the thermosensor and used for adjusting a frequency of the voltage controlled oscillation circuit.

According to this application example, it is possible to provide a temperature compensated oscillator capable of reducing noise that is superimposed on an output signal.

APPLICATION EXAMPLE 7

An electronic apparatus according to this application example includes the oscillator according to any of the application examples.

APPLICATION EXAMPLE 8

A moving object according to this application example includes the oscillator according to any of the application examples.

According to these application examples, since the oscillator capable of reducing noise that is superimposed on an output signal is used, it is possible to realize an electronic apparatus and a moving object both with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below do not unduly limit the contents of the invention set forth in the appended claims. Moreover, not all of the configurations described below may be essential components of the invention.

1. Oscillator 1-1. First Embodiment

Figure 1:
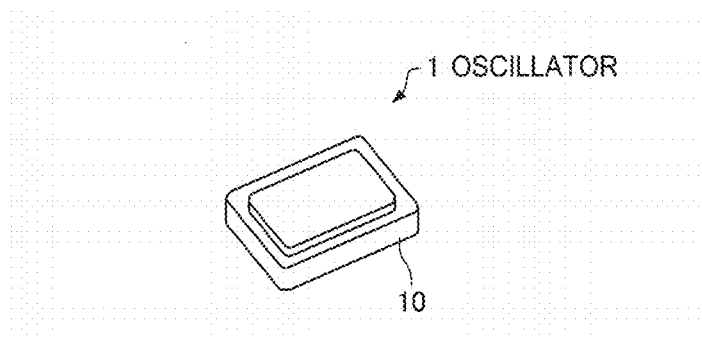
FIG. 1 is a perspective view of an oscillator of an embodiment.
Figure 2:
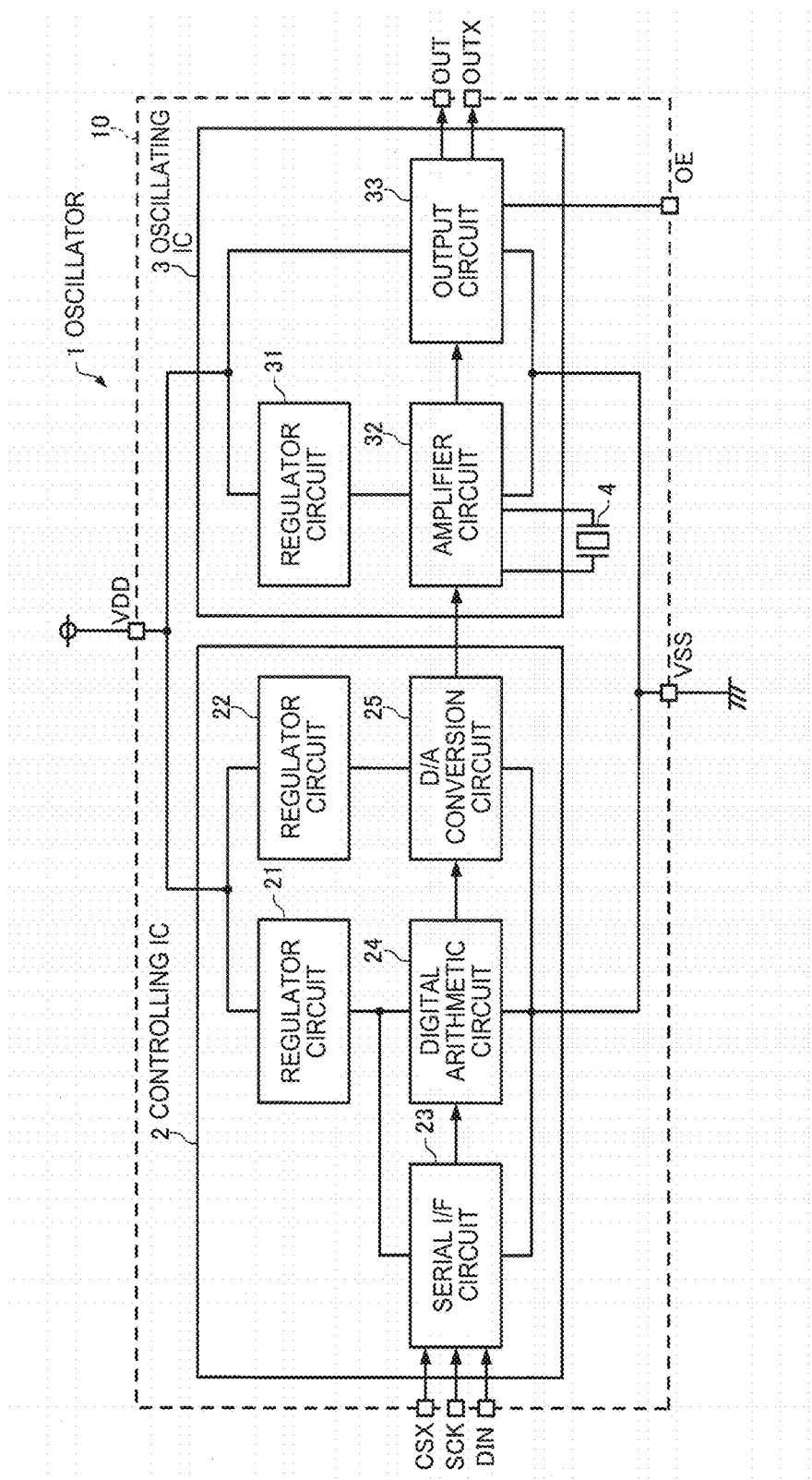
FIG. 2 is a diagram showing the configuration of an oscillator of a first embodiment.

FIG. 1 is a perspective view of an oscillator of an embodiment. FIG. 2 is a diagram showing the configuration of an oscillator of a first embodiment. The oscillator 1 of the first embodiment is a digitally controlled oscillator whose oscillation frequency can be controlled by a digital signal input from an external terminal. As shown in FIGS. 1 and 2, the oscillator 1 is configured to include a controlling integrated circuit (IC) 2, an oscillating integrated circuit (IC) 3, a quartz crystal resonator 4, and a package (container) 10 in which the controlling IC 2, the oscillating IC 3, and the quartz crystal resonator 4 are mounted.

The controlling IC 2 is supplied at a power supply terminal thereof with a power supply potential VDD from a power supply terminal VDD of the oscillator 1, and supplied at a ground terminal thereof with a ground potential VSS from a ground terminal GND, so that the controlling IC 2 operates. Similarly, the oscillating IC 3 is supplied at a power supply terminal thereof with the power supply potential VDD from the power supply terminal VDD of the oscillator 1, and supplied at a ground terminal thereof with the ground potential VSS from the ground terminal GND, so that the oscillating IC 3 operates.

As shown in FIG. 2, the controlling IC 2 is configured to include a regulator circuit 21, a regulator circuit 22, a serial interface circuit 23, a digital arithmetic circuit 24, and a D/A conversion circuit (digital-to-analog converter (DAC)) 25.

The regulator circuit 21 is a voltage regulator that generates a constant voltage from the power supply potential VDD and supplies the constant voltage to the serial interface circuit 23 and the digital arithmetic circuit 24.

The regulator circuit 22 is a voltage regulator that generates a constant voltage from the power supply potential VDD and supplies the constant voltage to a power supply node of the D/A conversion circuit 25, or a current regulator that generates a constant current from the power supply potential VDD and supplies the constant current to the power supply node of the D/A conversion circuit 25.

The serial interface circuit 23 receives a chip select signal, a serial data signal, and a clock signal that are input from three external terminals CSX, SCK, and DAIN, respectively, of the oscillator 1 via three terminals of the controlling IC 2. The serial interface circuit 23 acquires the serial data signal in synchronization with the clock signal when the chip select signal is active, and outputs the serial data signal to the digital arithmetic circuit 24. The serial interface circuit 23 may be, for example, an interface circuit for a serial peripheral interface (SPI) bus. Although the serial interface circuit 23 is a three-wire interface circuit in the embodiment, the invention is not limited to this. For example, the serial interface circuit 23 may be a two-wire interface circuit for an inter-integrated circuit (I$^2$C) bus.

The digital arithmetic circuit 24 converts the serial data signal output by the serial interface circuit 23 into an N-bit data signal, and outputs the N-bit data signal.

The D/A conversion circuit 25 converts the N-bit data signal output by the digital arithmetic circuit 24 into an analog signal to thereby generate a control signal for controlling the oscillating IC 3, and outputs the analog signal from a terminal of the controlling IC 2. An output terminal of the D/A conversion circuit 25 and a control terminal (input terminal of the control signal) of the oscillating IC 3 may be connected via a passive element such as a resistor or a capacitor.

The oscillating IC 3 is connected with the quartz crystal resonator 4, and resonates the quartz crystal resonator 4 at a frequency in response to the control signal output by the controlling IC 2 to output an oscillation signal. This oscillation signal is output as differential oscillation signals to the outside of the oscillator 1 via two external terminals OUT and OUTX of the oscillator 1. Moreover, the oscillating IC 3 controls a resonance frequency of the quartz crystal resonator 4 based on the control of the controlling IC 2. The quartz crystal resonator 4 is an example of a resonator, and other resonators may be used instead of the quartz crystal resonator 4. The resonator maybe an electrical resonant circuit, or may be an electromechanical resonator or the like. The resonator may be, for example, a resonator. The resonator may be, for example, a piezoelectric resonator, a surface acoustic wave (SAW) resonator, a micro electro mechanical systems (MEMS) resonator, or the like. Moreover, as a substrate material of the resonator, piezoelectric single crystal such as quartz crystal, lithium tantalate, or lithium niobate, a piezoelectric material such as piezoelectric ceramics including lead zirconate titanate, a silicon semiconductor material, or the like can be used. As a means of exciting the resonator, a piezoelectric effect maybe used, or an electrostatic drive using the Coulomb force maybe used. Moreover, the resonator may be an optical resonator that uses a gas cell containing alkali metal or the like therein and light interacting with atoms such as those of alkali metal, a cavity resonator, a dielectric resonator, or an LC resonator that resonates in the microwave region, or the like.

The external power supply terminal pair (in FIG. 2, the pair composed of the power supply terminal VDD supplied with the power supply potential VDD and the ground terminal GND supplied with the ground potential VSS) of the oscillator 1 may include only one terminal. With this configuration, the oscillator 1 can be miniaturized, and an oscillation signal can be output by supplying only a one-system power supply voltage to the oscillator 1. Therefore, the oscillator 1 can be used as a clock source of a system. However, the oscillator 1 of the embodiment may include external power supply terminal pairs for two systems or more (e.g., a power supply terminal pair for the controlling IC 2 and a power supply terminal pair for the oscillating IC 3).

As shown in FIG. 2, the oscillating IC 3 is configured to include a regulator circuit 31, an amplifier circuit 32, and an output circuit 33.

The regulator circuit 31 is a current regulator that generates a constant current from the power supply potential VDD and supplies the constant current to a power supply node of the amplifier circuit 32, or a voltage regulator that generates a constant voltage from the power supply potential VDD and supplies the constant voltage to the power supply node of the amplifier circuit 32.

The amplifier circuit 32 amplifies a signal output from the quartz crystal resonator 4 with, for example, a bipolar transistor that operates with a current supplied from the regulator circuit 31, and feeds the amplified signal back to the quartz crystal resonator 4 to thereby resonate the quartz crystal resonator 4. Alternatively, the amplifier circuit 32 may amplify the signal output from the quartz crystal resonator 4 with a CMOS inverter element that operates with a voltage supplied from the regulator circuit 31, and feed the amplified signal back to the quartz crystal resonator 4 to thereby resonate the quartz crystal resonator 4.

The amplifier circuit 32 includes a variable capacitive element (not shown) that functions as the load capacitance of the quartz crystal resonator 4. To this variable capacitive element, the voltage (control voltage) of the control signal output by the controlling IC 2 is applied via a terminal (control terminal) of the oscillating IC 3, so that the capacitance value of the variable capacitive element is controlled by the control voltage. The oscillation frequency of the quartz crystal resonator 4 changes in response to the capacitance value of the variable capacitive element.

The amplifier circuit 32 and the quartz crystal resonator 4 may constitute various types of oscillation circuits such as a Pierce oscillation circuit, an inverter oscillation circuit, a Colpitts oscillation circuit, or a Hartley oscillation circuit.

The output circuit 33 generates, for example, an oscillation signal by buffering or level-shifting the signal (input signal of the quartz crystal resonator 4) amplified by the amplifier circuit 32, and outputs the oscillation signal. The output circuit 33 generates, for example, differential oscillation signals in accordance with any of standards such as low-voltage positive-referenced emitter coupled logic (LVPECL), low-voltage differential signals (LVDS), and high-speed current steering logic (HCSL). The output circuit 33 outputs the oscillation signals from two terminals of the oscillating IC 3 when an external terminal OE is at H (high) level, while stopping the output of the oscillation signals when the external terminal OE is at L (low) level. The differential oscillation signals output from the oscillating IC 3 are output from the two external terminals OUT and OUTX of the oscillator 1 to the outside. The output circuit 33 may generate a single-ended oscillation signal such as a CMOS-level oscillation signal, and output the oscillation signal from the external terminal OUT to the outside. In this case, the external terminal OUTX is not necessary.

The amplifier circuit 32, or the amplifier circuit 32 and the output circuit 33 function as an oscillating circuit for resonating the quartz crystal resonator 4.

Figure 3:
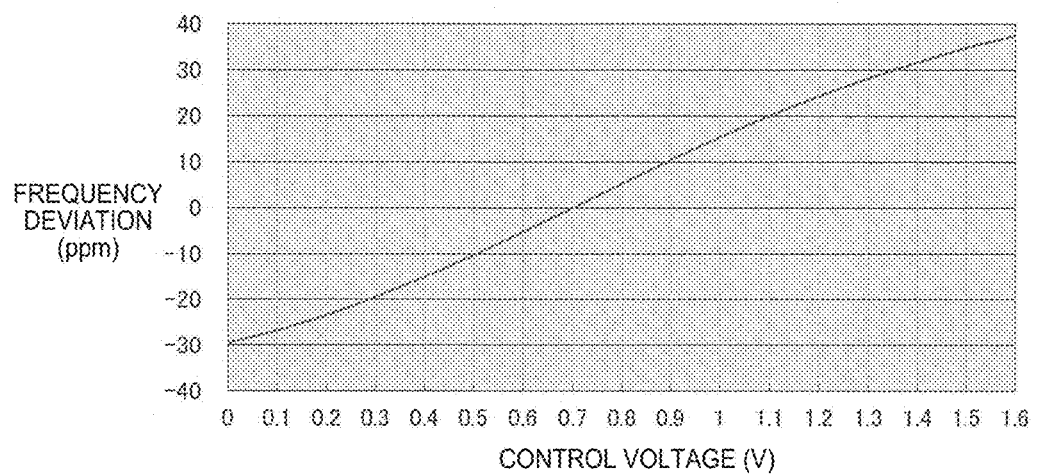
FIG. 3 is a graph showing an example of the relationship between a control voltage and the frequency of an oscillation signal.

An oscillation circuit composed of the oscillating IC 3 and the quartz crystal resonator 4 functions as a voltage controlled crystal oscillation circuit (an example of a voltage controlled oscillation circuit) that outputs an oscillation signal at a frequency in response to the voltage (control voltage) of the control signal output by the controlling IC 2. FIG. 3 shows an example of the relationship between the control voltage and the frequency of the oscillation signal. In FIG. 3, the horizontal axis represents the control voltage (unit: V), while the vertical axis represents the frequency deviation (unit: ppm) of the oscillation signal. As is apparent from FIG. 3, when noise is superimposed on the control voltage, the frequency of the oscillation signal fluctuates in response to the noise level. That is, the noise superimposed on the control signal propagating from the controlling IC 2 to the oscillating IC 3 has high frequency sensitivity and thus becomes a big factor that degrades the frequency accuracy of the oscillator 1, and therefore, it is desirable to remove the noise as much as possible. Since this noise is high bandwidth noise that appears as a glitch of the output voltage of the D/A conversion circuit 25, it is easy to remove the noise with a low-pass filter such as an RC filter.

On the other hand, since the N-bit data signal to be input to the D/A conversion circuit 25 changes dynamically by external settings, there is also noise that is generated by the switching of the D/A conversion circuit 25 and propagates from the power supply node of the D/A conversion circuit 25 through the regulator circuit 22 and the VDD power supply node to the oscillating IC 3. This noise is current peak noise that is generated when the N-bit data signal changes, and therefore, the only countermeasure is to add a capacitor to the VDD power supply node or the power supply node of the D/A conversion circuit 25, so that there is a problem in that the scale of the oscillator 1 is increased.

Figure 4:
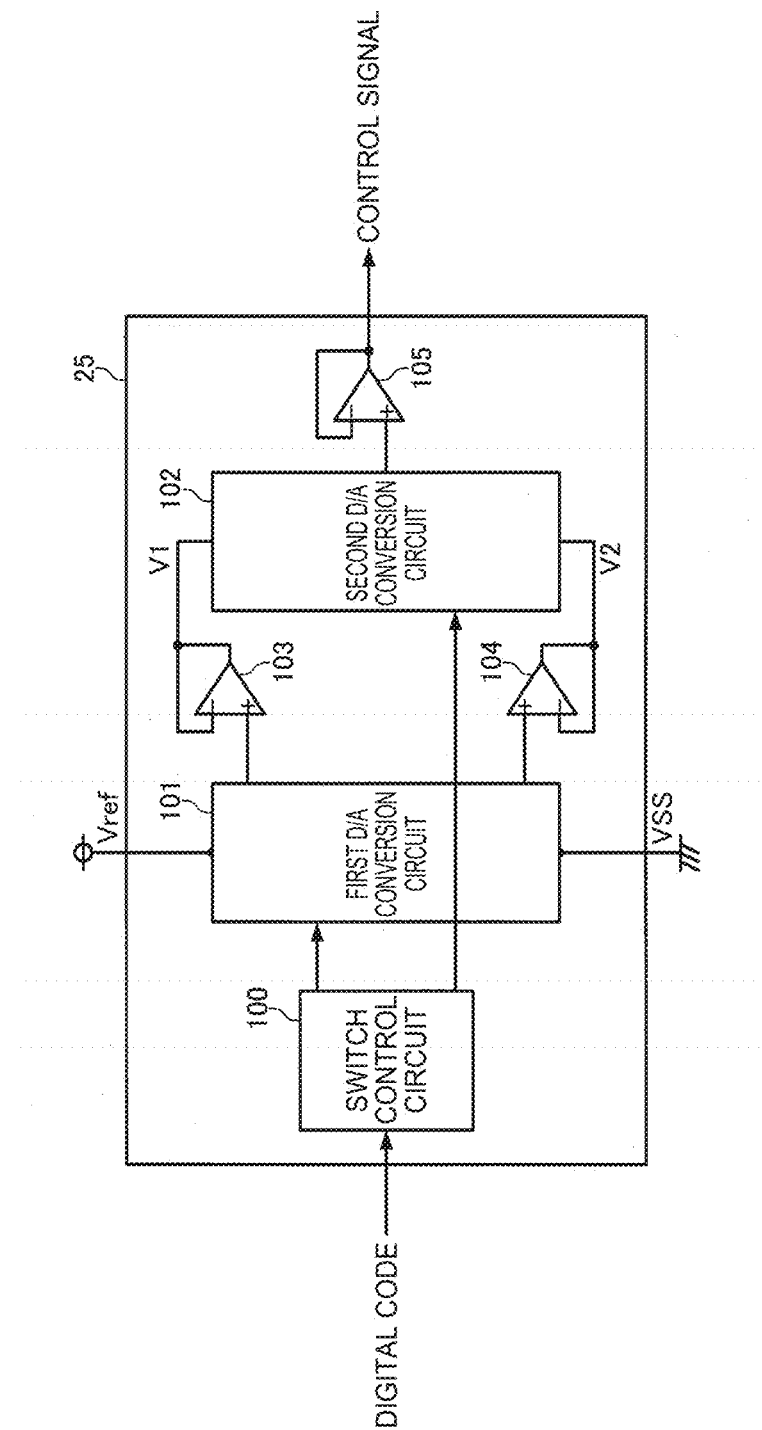
FIG. 4 is a diagram showing a schematic configuration of a D/A conversion circuit in the first embodiment.

In order to solve this problem, the D/A conversion circuit 25 in the embodiment is configured so as to generate little current peak noise that is generated when the N-bit data signal changes. FIG. 4 is a diagram showing a schematic configuration of the D/A conversion circuit 25 in the embodiment. As shown in FIG. 4, the D/A conversion circuit 25 (an example of a control voltage generator) is configured to include a switch control circuit 100, a first D/A conversion circuit 101, a second D/A conversion circuit 102, an operational amplifier 103, an operational amplifier 104, and an operational amplifier 105. The D/A conversion circuit 25 includes at least the first D/A conversion circuit 101, and the other components are not essential. Moreover, the D/A conversion circuit 25 may include a component other than the components shown in FIG. 4.

The switch control circuit 100 receives an N-bit data signal and controls, in response to the values of high-order m bits of the N-bit data signal, the turning on/off of a switch group included in the first D/A conversion circuit 101. Moreover, the switch control circuit 100 controls, in response to the values of low-order n bits (n=N−m) of the N-bit data signal, the turning on/off of a switch group included in the second D/A conversion circuit 102.

The first D/A conversion circuit 101 is a resistor voltage-dividing type (also called a voltage-dividing type, a resistor string type, or a voltage potentiometer type) D/A conversion circuit that generates a voltage between a reference voltage Vref (an example of a first reference voltage) and the ground potential VSS (an example of a second reference voltage). Specifically, the turning on/off of the switch group (not shown) of the first D/A conversion circuit 101 is controlled in response to the values of the high-order m bits of the N-bit data signal, and the first D/A conversion circuit 101 selects a voltage obtained by dividing a voltage corresponding to a difference between the reference voltage Vref and the ground potential VSS with a resistor group (not shown), and outputs the selected voltage to supply as a reference voltage V1 of the second D/A conversion circuit 102 via the operational amplifier 103. Further, the first D/A conversion circuit 101 may select another voltage obtained by dividing the voltage corresponding to the difference between the reference voltage Vref and the ground potential VSS with the resistor group in response to the values of the high-order m bits of the N-bit data signal, and output the selected voltage to supply as a reference voltage V2 of the second D/A conversion circuit 102 via the operational amplifier 104.

The second D/A conversion circuit 102 is a D/A conversion circuit that generates the control voltage from the voltage generated by the first D/A conversion circuit 101. Specifically, the turning on/off of the switch group (not shown) of the second D/A conversion circuit 102 is controlled in response to the values of the low-order n bits of the N-bit data signal, and the second D/A conversion circuit 102 selects a voltage corresponding to a difference between the reference voltage V1 and the reference voltage V2 (or a voltage corresponding to a difference between the reference voltage V2 and the reference voltage V1), and outputs the selected voltage as the control voltage of the oscillating IC 3 via the operational amplifier 105. Alternatively, the second D/A conversion circuit 102 may select a voltage obtained by dividing a voltage corresponding to a difference between the reference voltage V1 and the ground potential VSS with the resistor group (not shown) in response to the values of the low-order n bits of the N-bit data signal, and output the selected voltage as the control voltage of the oscillating IC 3 via the operational amplifier 105.

The second D/A conversion circuit 102 may be a resistor voltage-dividing type D/A conversion circuit. Alternatively, the second D/A conversion circuit 102 may be a D/A conversion circuit other than that of the resistor voltage-dividing type, such as those of the resistor ladder type including the R-2R type, the pulse-width modulation (PWM) type, the delta-sigma type, and the capacitor array type.

The operational amplifier 103 receives the voltage generated by the first D/A conversion circuit 101, and outputs the voltage as the reference voltage V1 to the second D/A conversion circuit 102. That is, the operational amplifier 103 has an output terminal and an inverting input terminal (−terminal) connected to each other, and functions as a voltage follower that propagates a voltage (the voltage V1 generated by the first D/A conversion circuit 101) at a non-inverting input terminal (+terminal) to the output terminal.

The operational amplifier 104 receives the voltage generated by the first D/A conversion circuit 101, and outputs the voltage as the reference voltage V2 to the second D/A conversion circuit 102. That is, the operational amplifier 104 has an output terminal and an inverting input terminal (−terminal) connected to each other, and functions as a voltage follower that propagates a voltage (the voltage V2 generated by the first D/A conversion circuit 101) at a non-inverting input terminal (+terminal) to the output terminal.

The operational amplifier 105 receives the voltage generated by the second D/A conversion circuit 102, and outputs the voltage as the control voltage to the oscillating IC 3. That is, the operational amplifier 105 has an output terminal and an inverting input terminal (−terminal) connected to each other, and functions as a voltage follower that propagates a voltage (the voltage generated by the second D/A conversion circuit 102) at a non-inverting input terminal (+terminal) to the output terminal.

The D/A conversion circuit 25 configured as described above functions as an N-bit D/A conversion circuit that generates a control voltage between the reference voltage Vref and the ground potential VSS with an N-bit data signal. The N-bit data signal, which dynamically changes by external settings, is input to the D/A conversion circuit 25. In general, however, only a resistor group is connected between the reference voltage Vref (high-potential-side reference voltage) and the ground potential VSS (low-potential-side reference voltage) in the first D/A conversion circuit 101 of the resistor voltage-dividing type, and therefore, a current that flows into the resistor group changes little in the switching of the turning on/off of the switch group. Accordingly, there is little current peak noise that is generated when the N-bit data signal changes, and noise that propagates from the power supply node of the D/A conversion circuit 25 through the regulator circuit 22 and the VDD power supply node to the oscillating IC 3 is extremely small.

Figure 5:
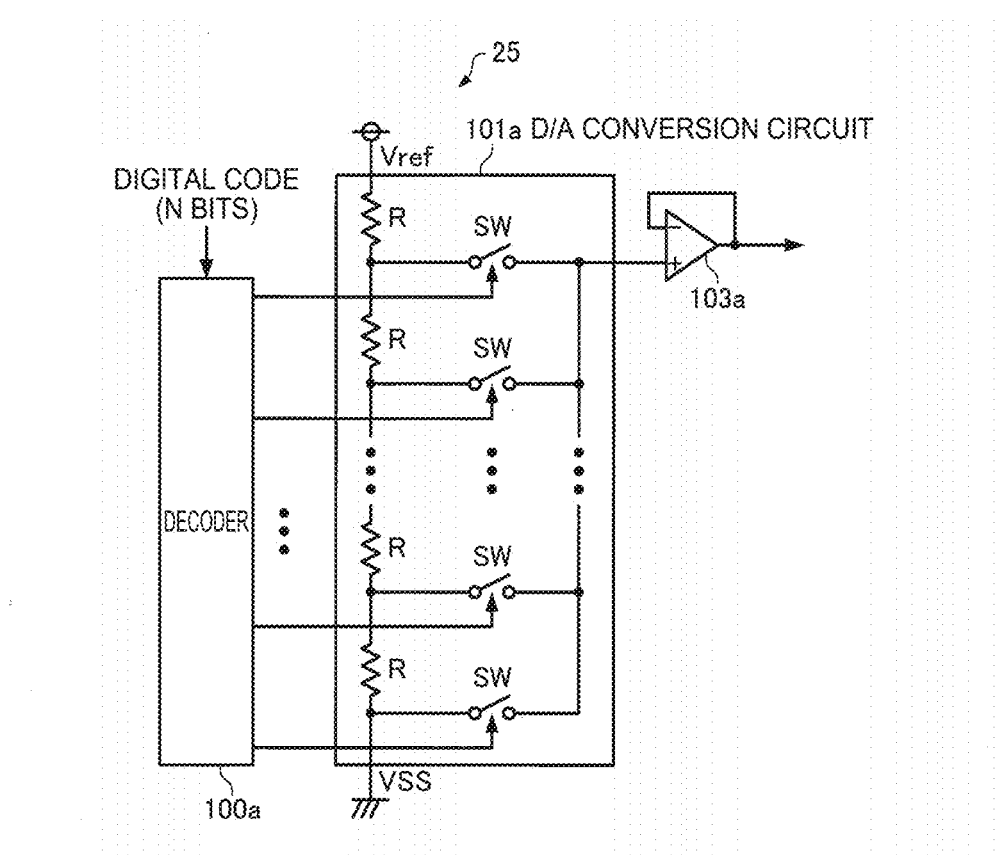
FIG. 5 is a diagram showing a first configuration example of the D/A conversion circuit.

FIG. 5 is a diagram showing a first configuration example of the D/A conversion circuit 25. The D/A conversion circuit 25 in the example of FIG. 5 is configured to include a decoder 100a, a D/A conversion circuit 101a, and an operational amplifier 103a.

The decoder 100a receives an N-bit data signal (digital code), and brings, in response to the values of the N-bit digital code, anyone switch SW of $2^N$ switches SW included in the D/A conversion circuit 101a into an on-state while bringing the other switches SW into an off-state. The decoder 100a corresponds to the switch control circuit 100 in FIG. 4.

The D/A conversion circuit 101a is a resistor voltage-dividing type D/A conversion circuit configured to include $2^N$ resistors R having the same resistance value and the $2^N$ switches SW. The $2^N$ resistors R are connected in series between a power supply node for supplying the reference voltage Vref and a ground for supplying the ground potential VSS. One ends of the $2^N$ switches SW are connected respectively with one ends of the $2^N$ resistor R, while the other ends are connected with a non-inverting input terminal (+terminal) of the operational amplifier 103a. Each of the $2^N$ switches SW may be, for example, a P-channel MOS transistor or an N-channel MOS transistor, or may be a complementary analog switch (transfer gate) composed of a P-channel MOS transistor and an N-channel MOS transistor. The D/A conversion circuit 101a corresponds to the first D/A conversion circuit 101 in FIG. 4.

The operational amplifier 103a has an output terminal and an inverting input terminal (−terminal) connected to each other, and functions as a voltage follower that propagates a voltage at the non-inverting input terminal (+terminal) to the output terminal. The operational amplifier 103a corresponds to the operational amplifier 103 in FIG. 4.

The D/A conversion circuit 25 configured as described above functions as an N-bit D/A conversion circuit that generates $2^N$ kinds of control voltages between the reference voltage Vref and the ground potential VSS with an N-bit digital code. The D/A conversion circuit 25 shown in FIG. 5 does not include circuits corresponding to the second D/A conversion circuit 102, the operational amplifier 104, and the operational amplifier 105 in FIG. 4.

Figure 6:
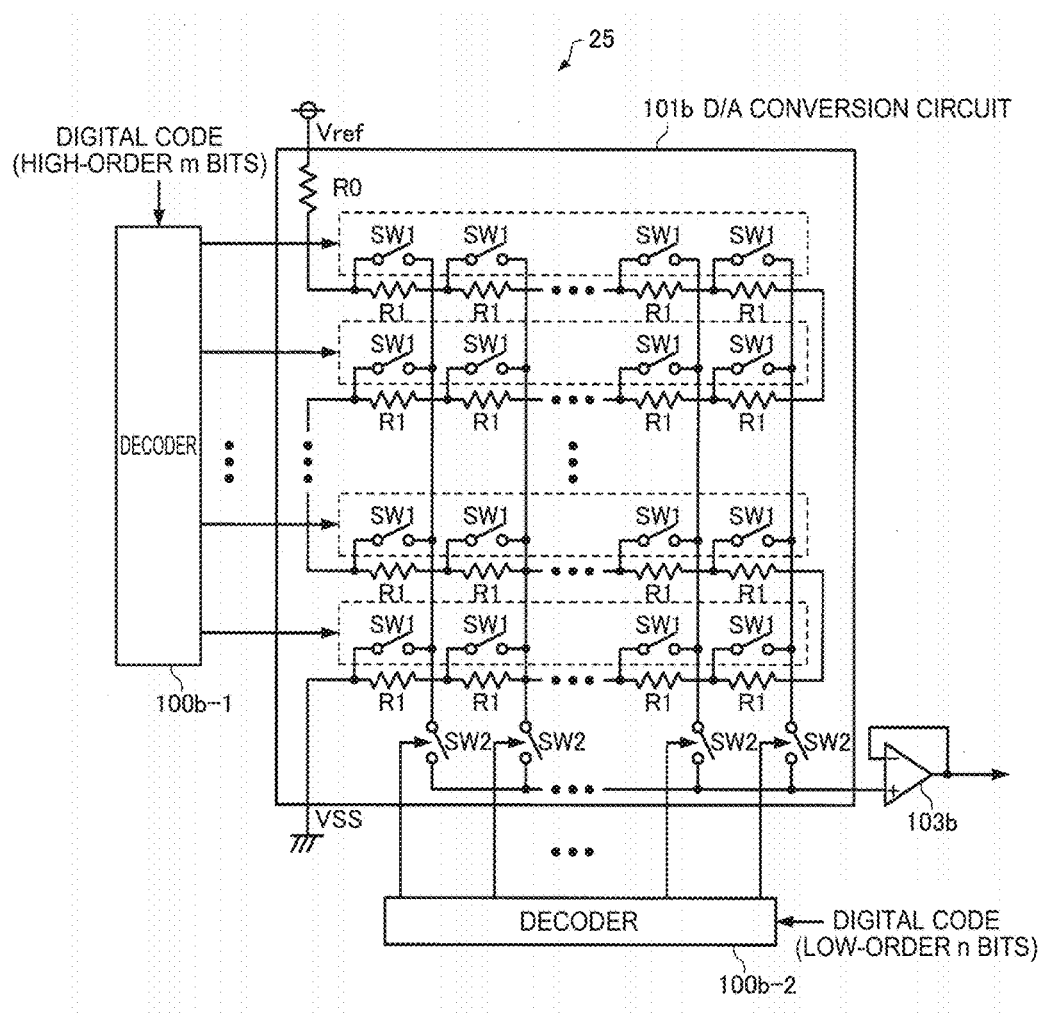
FIG. 6 is a diagram showing a second configuration example of the D/A conversion circuit.

FIG. 6 is a diagram showing a second configuration example of the D/A conversion circuit 25. The D/A conversion circuit 25 in the example of FIG. 6 is configured to include a decoder 100b-1, a decoder 100b-2, a D/A conversion circuit 101b, and an operational amplifier 103b.

The decoder 100b-1 receives a high-order m-bit digital code of an N-bit data signal (digital code), and simultaneously brings, in response to the values of the m-bit digital code, $2^n$ switches SW1 included in any of $2^m$ switch groups (switch groups surrounded by the broken lines in FIG. 6) in $2^N$ switches SW1 included in the D/A conversion circuit 101b into the on-state while bringing all the other switches SW1 into the off-state.

The decoder 100b-2 receives a low-order n-bit (n=N−m) digital code of the N-bit digital code, and brings, in response to the values of the n-bit digital code, anyone switch SW2 of $2^n$ switches SW2 included in the D/A conversion circuit 101b into the on-state while bringing all the other switches SW2 into the off-state.

A circuit composed of the decoder 100b-1 and the decoder 100b-2 corresponds to the switch control circuit 100 in FIG. 4.

The D/A conversion circuit 101b is a matrix resistor-arrangement type (one kind of the resistor voltage-dividing type) D/A conversion circuit configured to include a resistor R0, $2^N$ resistors R1 having the same resistance value, the $2^N$ switches SW1, and the $2^n$ switches SW2. The resistance value of the resistor R0 may be the same as the resistance value of the $2^N$ resistors R1. The resistor R0 and the $2^N$ resistors R1 are connected in series between a power supply node for supplying the reference voltage Vref and a ground for supplying the ground potential VSS. One ends of the $2^N$ switches SW1 are connected respectively with one ends of the $2^N$ resistors R1. Moreover, the other end of each of the $2^n$ switches SW1 included in each of the $2^m$ switch groups (switch groups surrounded by the broken lines in FIG. 6) in the $2^N$ switches SW1 is connected with one end of any one of the $2^n$ switches SW2 in a regular manner together with one switch SW1 included in each of the other switch groups. The other ends of the $2^n$ switches SW2 are together connected with a non-inverting input terminal (+terminal) of the operational amplifier 103b. Each of the $2^N$ switches SW1 or the $2^n$ switches SW2 may be, for example, a P-channel MOS transistor or an N-channel MOS transistor, or may be a complementary analog switch (transfer gate) composed of a P-channel MOS transistor and an N-channel MOS transistor. The D/A conversion circuit 101a corresponds to the first D/A conversion circuit 101 in FIG. 4. The D/A conversion circuit 101b corresponds to the first D/A conversion circuit 101 in FIG. 4.

The operational amplifier 103b has an output terminal and an inverting input terminal (−terminal) connected to each other, and functions as a voltage follower that propagates a voltage at the non-inverting input terminal (+terminal) to the output terminal. The operational amplifier 103b corresponds to the operational amplifier 103 in FIG. 4.

The D/A conversion circuit 25 configured as described above functions as an N-bit D/A conversion circuit that generates $2^N$ kinds of control voltages between the reference voltage Vref and the ground potential VSS with an N-bit digital code. The D/A conversion circuit 25 shown in FIG. 6 does not include circuits corresponding to the second D/A conversion circuit 102, the operational amplifier 104, and the operational amplifier 105 in FIG. 4.

Figure 7:
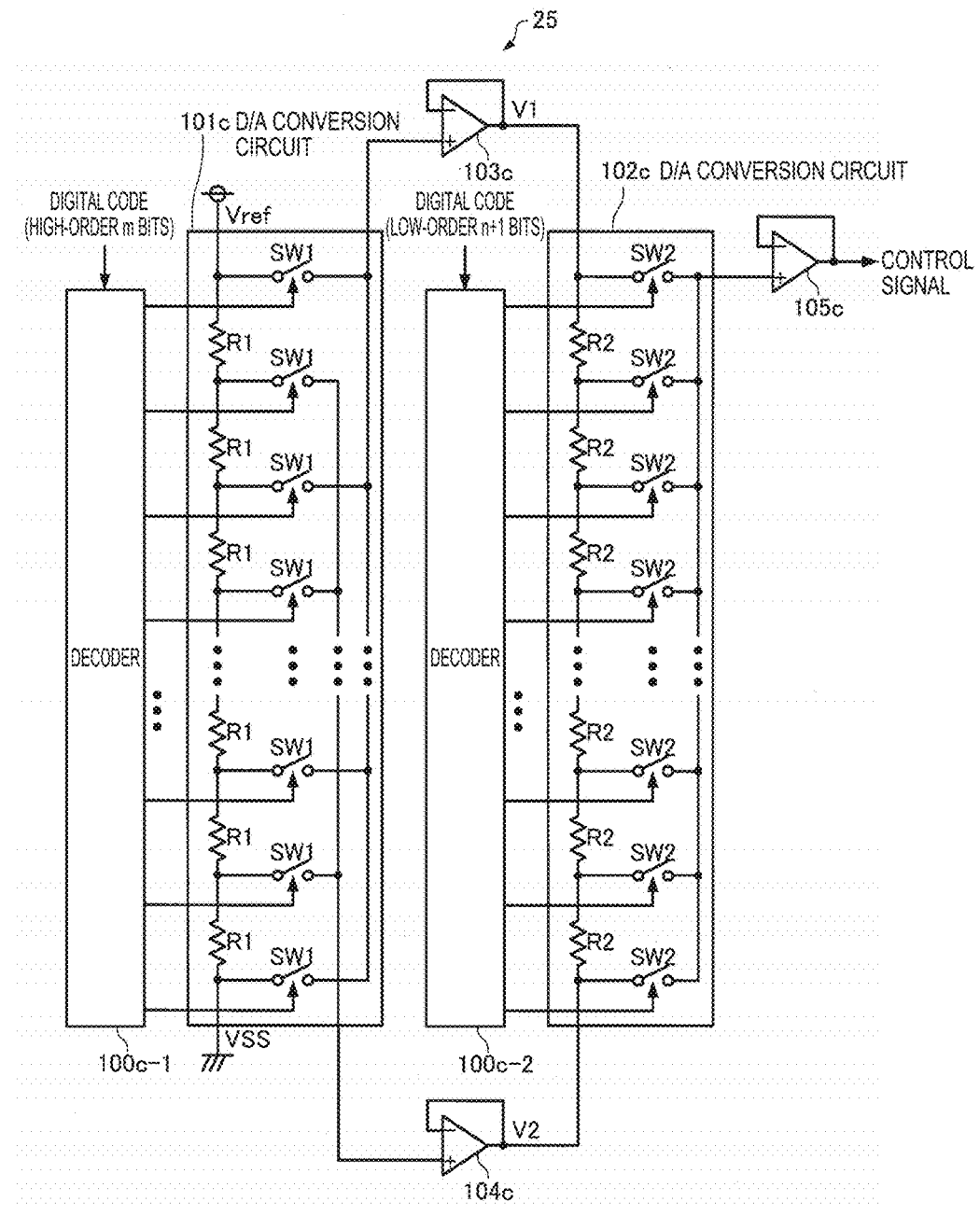
FIG. 7 is a diagram showing a third configuration example of the D/A conversion circuit.

FIG. 7 is a diagram showing a third configuration example of the first D/A conversion circuit 101. The D/A conversion circuit 25 in the example of FIG. 7 is configured to include a decoder 100c-1, a decoder 100c-2, a D/A conversion circuit 101c, a D/A conversion circuit 102c, an operational amplifier 103c, an operational amplifier 104c, and an operational amplifier 105c.

The decoder 100c-1 receives a high-order m-bit digital code of an N-bit data signal (digital code), and simultaneously brings, in response to the values of the m-bit digital code, any two switches SW1 that are connected with both ends of each of $2^N$ resistors R1 included in the D/A conversion circuit 101c in $2^N+1$ switches SW1 included in the D/A conversion circuit 101c into the on-state while bringing all the other switches SW1 into the off-state.

The decoder 100c-2 receives a low-order n+1-bit (n=N−m) digital code of the N-bit digital code, and brings, in response to the values of the n+1-bit digital code, any one switch SW2 of $2^n+1$ switches SW2 included in the D/A conversion circuit 102c into the on-state while bringing all the other switches SW2 into the off-state. Specifically, when an output voltage V1 of the operational amplifier 103c is higher than an output voltage V2 of the operational amplifier 104c (e.g., when the value of the highest-order bit (the lowest-order bit of the high-order m-bit digital code of the N-bit digital code) of the n+1-bit digital code is 1), the decoder 100c-2 brings only anyone SW2 of the $2^n$ switches SW2 from the output terminal side of the operational amplifier 104c into the on-state in response to the values of low-order n bits of the n+1-bit digital code. Moreover, when the output voltage of the operational amplifier 103c is lower than the output voltage of the operational amplifier 104c (e.g., when the value of the highest-order bit (the lowest-order bit of the high-order m-bit digital code of the N-bit digital code) of the n+1-bit digital code is 0), the decoder 100c-2 brings only any one SW2 of the $2^n$ switches SW2 from the output terminal side of the operational amplifier 103c into the on-state in response to the values of low-order n bits of the n+1-bit digital code.

A circuit composed of the decoder 100c-1 and the decoder 100c-2 corresponds to the switch control circuit 100 in FIG. 4.

The D/A conversion circuit 101c is a resistor voltage-dividing type D/A conversion circuit configured to include $2^m$ resistors R1 having the same resistance value and $2^m+1$ switches SW1. The $2^m$ resistors R1 are connected in series between a power supply node for supplying the reference voltage Vref and a ground for supplying the ground potential VSS. One end of each of the $2^m+1$ switches SW1 is connected with one end of any of the $2^m$ resistors R1. Moreover, the other ends of $2^{m-1}+1$ switches SW1 that are alternately disposed in order from the high potential side in the $2^m+1$ switches SW1 are connected with a non-inverting input terminal (+terminal) of the operational amplifier 103c, while the other ends of the other $2^m-1$ switches SW1 are connected with a non-inverting input terminal (+terminal) of the operational amplifier 104c. Each of the $2^m+1$ switches SW1 may be, for example, a P-channel MOS transistor or an N-channel MOS transistor, or may be a complementary analog switch (transfer gate) composed of a P-channel MOS transistor and an N-channel MOS transistor. The D/A conversion circuit 101c corresponds to the first D/A conversion circuit 101 in FIG. 4. The D/A conversion circuit 101c selects, in response to the values of the high-order m-bit digital code, potentials at both ends of any one of the $2^m$ resistors R1, and supplies the potentials to the non-inverting input terminal (+terminal) of the operational amplifier 103c and the non-inverting input terminal (+terminal) of the operational amplifier 104c.

The operational amplifier 103c has an output terminal and an inverting input terminal (−terminal) connected to each other, and functions as a voltage follower that propagates a voltage at the non-inverting input terminal (+terminal) to the output terminal. The operational amplifier 103c corresponds to the operational amplifier 103 in FIG. 4.

The operational amplifier 104c has an output terminal and an inverting input terminal (−terminal) connected to each other, and functions as a voltage follower that propagates a voltage at the non-inverting input terminal (+terminal) to the output terminal. The operational amplifier 104c corresponds to the operational amplifier 104 in FIG. 4.

The D/A conversion circuit 102c is a resistor voltage-dividing type D/A conversion circuit configured to include $2^n$ resistors R2 having the same resistance value and $2^n+1$ switches SW2. The $2^n$ resistors R2 are connected in series between the output terminal of the operational amplifier 103c and the output terminal of the operational amplifier 104c. One end of each of the $2^n+1$ switches SW2 is connected with any of the $2^n$ resistors R2, while the other end is connected with a non-inverting input terminal (+terminal) of the operational amplifier 105c. Each of the $2^n+1$ switches SW2 may be, for example, a complementary analog switch (transfer gate) composed of a P-channel MOS transistor and an N-channel MOS transistor. The D/A conversion circuit 102c corresponds to the second D/A conversion circuit 102 in FIG. 4. The D/A conversion circuit 102c selects, in response to the values of the low-order n+1-bit digital code, any one of $2^n$ kinds of voltages between the output voltage V1 of the operational amplifier 103c and the output voltage V2 of the operational amplifier 104c, and supplies the selected voltage to the non-inverting input terminal (+terminal) of the operational amplifier 105c.

The operational amplifier 105c has an output terminal and an inverting input terminal (−terminal) connected to each other, and functions as a voltage follower that propagates a voltage at the non-inverting input terminal (+terminal) to the output terminal. The operational amplifier 105c corresponds to the operational amplifier 105 in FIG. 4.

The D/A conversion circuit 25 configured as described above functions as an N-bit D/A conversion circuit that generates $2^N$ kinds of control voltages between the reference voltage Vref and the ground potential VSS with an N-bit digital code.

In the oscillator 1 of the embodiment as has been described above, the D/A conversion circuit 25 includes the first D/A conversion circuit 101 for converting an N-bit data signal (digital signal) into an analog signal (e.g., the D/A conversion circuit 101a in FIG. 5), or the first D/A conversion circuit 101 for converting a high-order m-bit data signal of an N-bit data signal into an analog signal (e.g., the D/A conversion circuit 101b in FIG. 6 or the D/A conversion circuit 101c in FIG. 7), which is composed of a resistor voltage-dividing type D/A conversion circuit. In the first D/A conversion circuit 101 of the resistor voltage-dividing type, in general, only a resistor is connected in series between the first reference voltage (e.g., the reference voltage Vref) and the second reference voltage (e.g., the ground potential VSS), and an active element whose operation changes in response to the N-bit data signal, such as a switch (a MOS transistor or a bipolar transistor), is not disposed between the first reference voltage and the second reference voltage. Therefore, even when a dynamically changing N-bit data signal is input to the D/A conversion circuit 25, and the turning on/off of the switch group included in the first D/A conversion circuit 101 is dynamically switched, a current that flows from the power supply node supplied with the first reference voltage to the resistor group changes little. Accordingly, there is little current peak noise that is generated when the N-bit data signal (high-order m-bit data signal) changes, noise that propagates from the power supply node of the D/A conversion circuit 25 through the regulator circuit 22 and the VDD power supply node to the oscillating IC 3 is extremely small, and thus noise that is superimposed on an output signal of the oscillator 1 can be reduced. Besides, according to the embodiment, since the noise that is superimposed on the output signal of the oscillator 1 is small, it is possible to realize a digitally controlled oscillator with high frequency accuracy. Moreover, according to the embodiment, also the resolution of the D/A conversion circuit 25 can be increased, and thus it is also possible to realize a high-resolution digitally controlled oscillator to which a data signal of 12 bits or more is input.

The first D/A conversion circuit 101 and the second D/A conversion circuit 102 (e.g., the D/A conversion circuit 101c and the D/A conversion circuit 102c in FIG. 7) are separated by the operational amplifier 103 or the operational amplifier 104 (e.g., the operational amplifier 103c or the operational amplifier 104c in FIG. 7), and therefore, noise that is generated in the second D/A conversion circuit 102 is less likely to propagate to the power supply node (the power supply node of the D/A conversion circuit 25) via the first D/A conversion circuit 101. Accordingly, even if current peak noise is generated in the second D/A conversion circuit 102 when the low-order n-bit data signal changes, noise that propagates to the power supply node of the D/A conversion circuit 25 due to the peak noise is small. Accordingly, in order to reduce the current peak noise that is generated when the low-order n-bit data signal changes, the second D/A conversion circuit 102 is preferably a resistor voltage-dividing type D/A conversion circuit like the D/A conversion circuit 102c in FIG. 7, but the second D/A conversion circuit 102 may not necessarily be a resistor voltage-dividing type D/A conversion circuit. For example, when the second D/A conversion circuit 102 is composed of a small-scale D/A conversion circuit, such as that of the R-2R type, there is an advantage in terms of the miniaturization of the oscillator 1.

1-2. Second Embodiment

An oscillator of a second embodiment differs from the oscillator of the first embodiment in the configuration of the controlling IC 2. In the oscillator of the second embodiment, components similar to those of the first embodiment are denoted by the same reference numerals and signs. In the following, a redundant description is omitted, and differences from the first embodiment will be mainly described.

Figure 8:
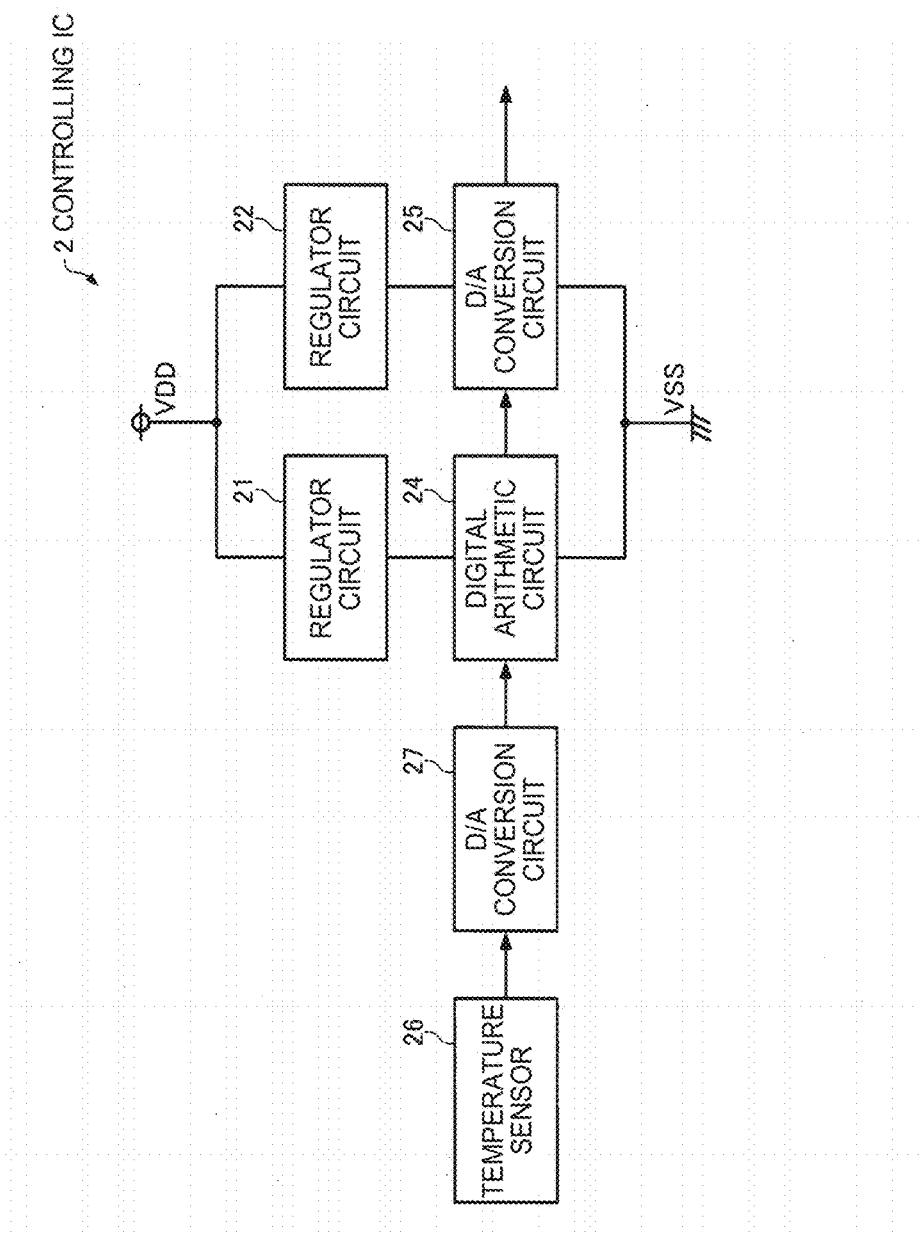
FIG. 8 is a diagram showing a configuration example of a controlling IC in an oscillator of a second embodiment.

FIG. 8 is a diagram showing the configuration of the controlling IC 2 in the oscillator of the second embodiment. As shown in FIG. 8, in the oscillator 1 of the second embodiment, the controlling IC 2 is configured to include the regulator circuit 21, the regulator circuit 22, the digital arithmetic circuit 24, the D/A conversion circuit 25, a temperature sensor 26, and an A/D conversion circuit (analog-to-digital converter (ADC)) 27.

The temperature sensor 26 is a thermosensor that outputs a signal in response to the ambient temperature (e.g., a voltage in response to the temperature), and is realized by, for example, a configuration including one or a plurality of diodes connected in series in the forward direction between an output of the temperature sensor 26 and a ground.

The A/D conversion circuit 27 converts an output signal of the temperature sensor 26 into a digital signal, and outputs the digital signal. As the A/D conversion circuit 27, those of various well-known types such as the parallel comparison type, the successive approximation type, the delta-sigma type, and the double integration type, can be used.

The digital arithmetic circuit 24 computes, using the output signal of the A/D conversion circuit 27, a digital value of a temperature compensated voltage for correcting frequency-temperature characteristics of the quartz crystal resonator 4 to generate an N-bit data signal, and outputs the N-bit data signal.

The D/A conversion circuit 25 converts this N-bit data signal into an analog signal to thereby generate a control signal for controlling the oscillating IC 3, and outputs the control signal from a terminal of the controlling IC 2.

The oscillator 1 configured as described above is a temperature compensated oscillator whose oscillation frequency can be maintained substantially constant irrespective of the temperature by adjusting the frequency of the oscillating IC 3 (voltage controlled oscillation circuit) with a digital signal based on a signal output from the temperature sensor 26.

Figure 9:
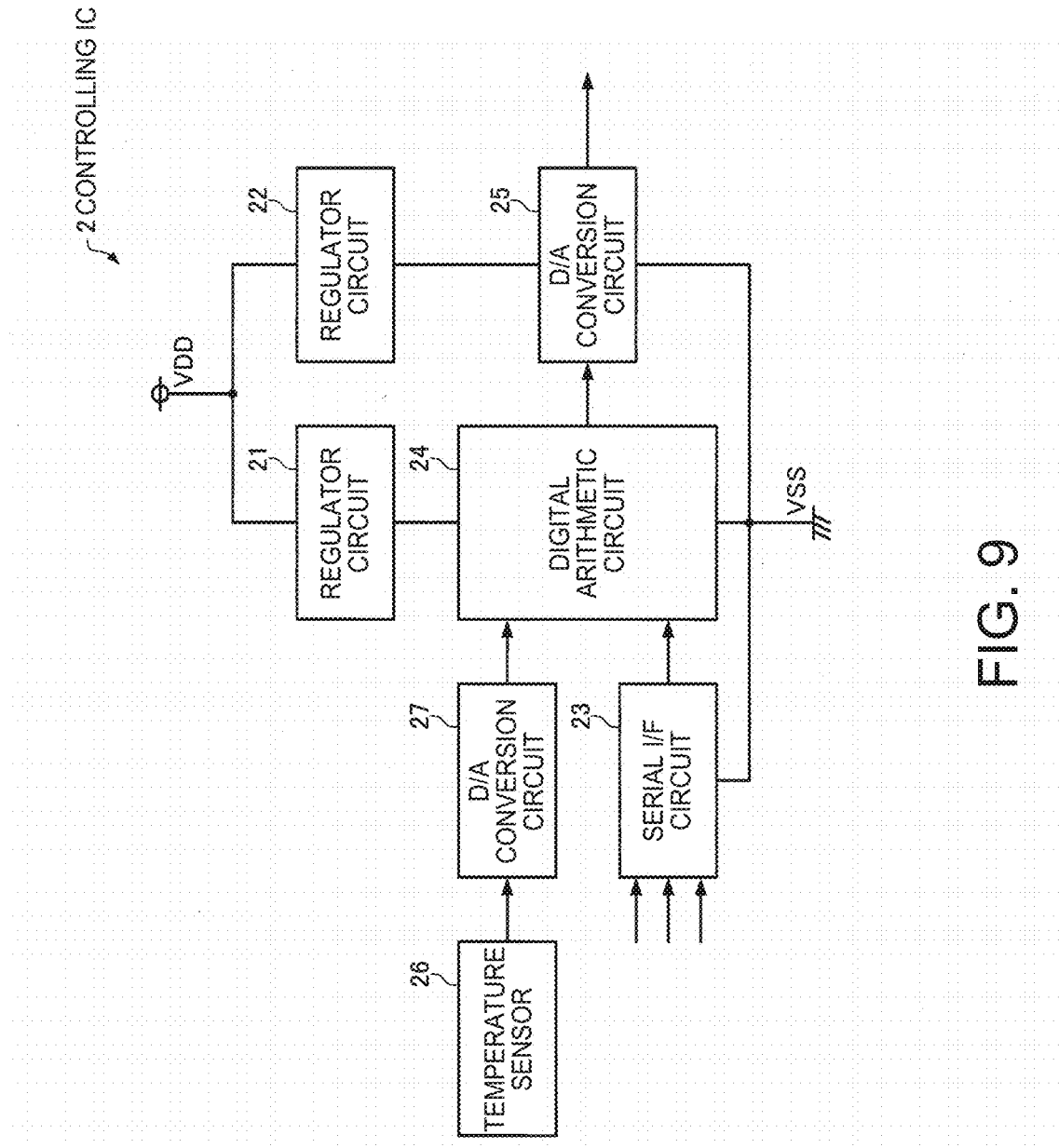
FIG. 9 is a diagram showing another configuration example of the controlling IC in the oscillator of the second embodiment.

Moreover, the oscillator 1 of the embodiment may have a configuration in which the controlling IC 2 in FIG. 8 is replaced with a configuration in FIG. 9. In FIG. 9, components similar to those of FIG. 8 are denoted by the same reference numerals and signs, and a redundant description is omitted. In the example of FIG. 9, the controlling IC 2 is configured to include the regulator circuit 21, the regulator circuit 22, the serial interface circuit 23, the digital arithmetic circuit 24, the D/A conversion circuit 25, the temperature sensor 26, and the A/D conversion circuit 27.

The digital arithmetic circuit 24 computes, using the output signal of the A/D conversion circuit 27, a digital value of a temperature compensated voltage for correcting frequency-temperature characteristics of the quartz crystal resonator 4, converts a serial data signal output by the serial interface circuit 23 into an N-bit digital value, adds the digital value to the digital value of the temperature compensated voltage to generate an N-bit data signal, and outputs the N-bit data signal.

The D/A conversion circuit 25 converts this N-bit data signal into an analog signal to thereby generate a control signal for controlling the oscillating IC 3, and outputs the control signal from the terminal of the controlling IC 2.

The oscillator 1 configured as described above is a temperature compensated oscillator whose oscillation frequency can be maintained substantially constant irrespective of the temperature by adjusting the frequency of the oscillating IC 3 (voltage controlled oscillation circuit) with the digital signal based on the signal output from the temperature sensor 26 and the digital signal input from an external terminal, and whose oscillation frequency can be controlled with the digital signal input from the external terminal.

Also in the oscillator 1 of the second embodiment, the D/A conversion circuit 25 is configured similarly to that of the first embodiment (FIG. 4). Accordingly, according to the second embodiment, since noise that is superimposed on the output signal of the oscillating IC 3 is small similarly to the first embodiment, it is possible to realize a temperature compensated oscillator or digitally controlled temperature compensated oscillator with high frequency accuracy. Moreover, according to the embodiment, also the resolution of the D/A conversion circuit 25 can be increased, and thus it is also possible to realize a temperature compensated oscillator or digitally controlled temperature compensated oscillator that enables temperature compensation with a high resolution of 12 bits or more.

1-3. Modified Example

The oscillator 1 of the first embodiment or the second embodiment can be variously modified. Some modified examples will be shown below.

1-3-1. First Modified Example

The oscillator 1 of each of the embodiments is composed of two IC chips, the controlling IC 2 and the oscillating IC 3, and the quartz crystal resonator 4. However, the oscillator 1 maybe composed of one IC chip having functions of the controlling IC 2 and the oscillating IC 3, and the quartz crystal resonator 4. Alternatively, the oscillator 1 may be composed of three or more IC chips and the quartz crystal resonator 4. For example, the serial interface circuit 23 and the digital arithmetic circuit 24 are removed from the controlling IC 2, and the serial interface circuit 23 and the digital arithmetic circuit 24 are configured as another IC, whereby the oscillator 1 may be composed of three IC chips and the quartz crystal resonator 4.

1-3-2. Second Modified Example

In the oscillator 1 of each of the embodiments as described above, the noise that is superimposed on the control signal output by the controlling IC 2 (the D/A conversion circuit 25) has high frequency sensitivity, and therefore becomes a big factor that degrades the frequency accuracy of the oscillator 1. So, in order to reliably attenuate the noise that is superimposed on the control signal, a low-pass filter may be disposed on a signal path through which the control signal propagates from the controlling IC 2 to the oscillating IC 3 in the oscillator 1 of each of the embodiments. As the low-pass filter, variously configured circuits are considered. For example, the low-pass filter may be configured using an inductor and a varactor diode (variable capacitive element). Since the noise that is superimposed on the control signal changes due to the operating frequency of the controlling IC 2 or the oscillation frequency of the oscillating IC 3, the cutoff frequency of the low-pass filter can be changed by changing the capacitance value of the varactor diode.

2. Electronic Apparatus

Figure 10:
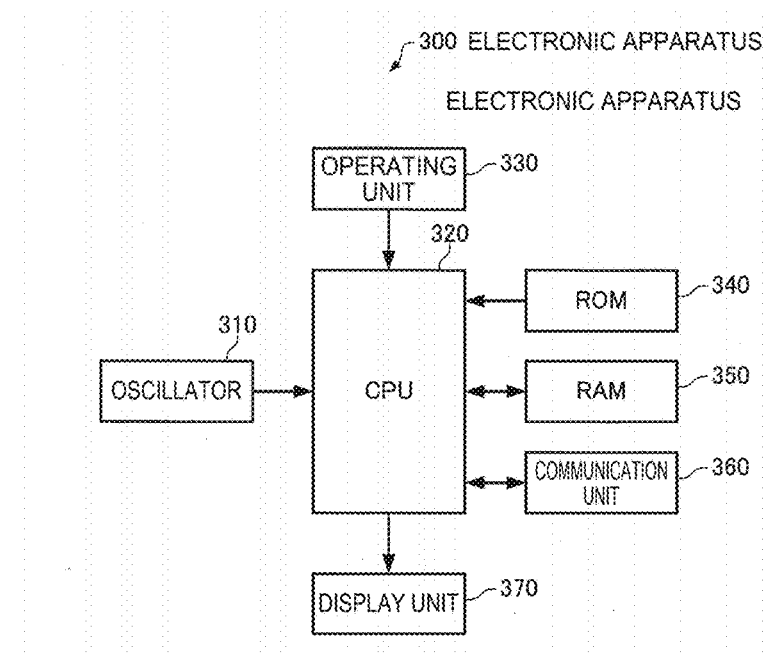
FIG. 10 is a functional block diagram showing an example of the configuration of an electronic apparatus of an embodiment.

FIG. 10 is a functional block diagram showing an example of the configuration of an electronic apparatus of an embodiment. The electronic apparatus 300 of the embodiment is configured to include an oscillator 310, a central processing unit (CPU) 320, an operating unit 330, a read only memory (ROM) 340, a random access memory (RAM) 350, a communication unit 360, and a display unit 370. The electronic apparatus of the embodiment may have a configuration in which a portion of the components (parts) in FIG. 10 is omitted or changed or another component is added.

The oscillator 310 incorporates therein a resonator (not shown), an oscillating circuit (not shown) that resonates the resonator, and a controlling circuit (not shown) that controls the oscillating circuit, and outputs an oscillation signal due to the resonance of the resonator. This oscillation signal is supplied from the oscillator 310 to the CPU 320.

The CPU 320 performs various kinds of computing processing or control processing according to programs stored in the ROM 340 or the like using as a clock signal the oscillation signal input from the oscillator 310. Specifically, the CPU 320 performs various kinds of processing in response to an operating signal from the operating unit 330, processing for controlling the communication unit 360 for performing data communication with an external device, processing for transmitting a display signal for causing the display unit 370 to display various kinds of information, or the like.

The operating unit 330 is an input device composed of an operating key, a button switch, and the like, and outputs an operating signal in response to a user's operation to the CPU 320.

The ROM 340 stores programs, data, and the like for the CPU 320 to perform various kinds of computing processing or control processing.

The RAM 350 is used as a working area of the CPU 320, and temporarily stores programs or data read from the ROM 340, data input from the operating unit 330, the results of operations executed by the CPU 320 according to various kinds of programs, and the like.

The communication unit 360 performs various kinds of control for establishing data communication between the CPU 320 and an external device.

The display unit 370 is a display device composed of a liquid crystal display (LCD) or the like, and displays various kinds of information based on the display signal input from the CPU 320. The display unit 370 may be provided with a touch panel that functions as the operating unit 330.

By applying, for example, the oscillator 1 of each of the embodiments or the oscillator 1 of each of the modified examples as the oscillator 310, an electronic apparatus with high reliability can be realized.

As the electronic apparatus 300, various types of electronic apparatuses are considered. For example, examples thereof include a personal computer (e.g., a mobile personal computer, a laptop personal computer, or a tablet personal computer), a mobile terminal such as a smartphone or a mobile phone, a digital still camera, an inkjet ejection apparatus (e.g., an inkjet printer), a digital phase-locked loop (PLL), a communication network apparatus (e.g., a storage area network apparatus such as a router or a switch, or a local area network apparatus), an apparatus for mobile terminal base station, a television set, a video camcorder, a video recorder, a car navigation system, a real-time clock device, a pager, an electronic notebook (including one with communication function), an electronic dictionary, a calculator, an electronic game console, a game controller, a word processor, a workstation, a videophone, a surveillance television monitor, electronic binoculars, a POS terminal, a medical device (e.g., an electronic thermometer, a sphygmomanometer, a blood glucose meter, an electrocardiogram measuring system, an ultrasonic diagnosis apparatus, and an electronic endoscope), a fishfinder, various types of measuring instrument, indicators (e.g., indicators used in a vehicle, aircraft, and a ship), a flight simulator, a head-mounted display, motion tracing, motion tracking, a motion controller, and pedestrian dead reckoning (PDR).

One example of the electronic apparatus 300 of the embodiment includes a transmission device that functions as a device for terminal base station or the like performing, for example, wired or wireless communication with a terminal using the oscillator 310 as a reference signal source, a voltage variable oscillator (VCO), or the like. By applying, for example, the oscillator 1 of each of the embodiments or the oscillator 1 of each of the modified examples as the oscillator 310, the electronic apparatus 300 of the embodiment can also be applied to a transmission apparatus that can be used for, for example, a communication base station or the like and of which high performance and high reliability are required.

3. Moving Object

Figure 11:
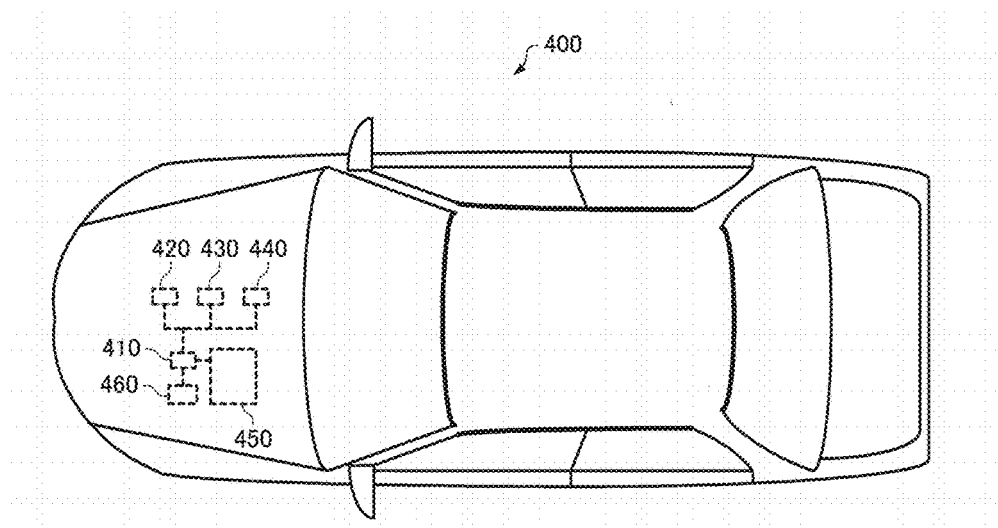
FIG. 11 is a diagram showing an example of a moving object of an embodiment.

FIG. 11 is a diagram (top view) showing an example of a moving object of an embodiment. The moving object 400 shown in FIG. 11 is configured to include an oscillator 410, controllers 420, 430, and 440 that perform various kinds of control for an engine system, a brake system, a keyless entry system, and the like, a battery 450, and a backup battery 460. The moving object of the embodiment may have a configuration in which a portion of the components (parts) in FIG. 11 is omitted or changed or another component is added.

The oscillator 410 incorporates therein a resonator (not shown), an oscillating circuit (not shown) that resonates the resonator, and a controlling circuit (not shown) that controls the oscillating circuit, and outputs an oscillation signal due to the resonance of the resonator. This oscillation signal is supplied from the oscillator 410 to the controllers 420, 430, and 440, and used as, for example, a clock signal.

The battery 450 supplies power to the oscillator 410 and the controllers 420, 430, and 440. The backup battery 460 supplies power to the oscillator 410 and the controllers 420, 430, and 440 when the output voltage of the battery 450 becomes lower than the threshold.

By applying, for example, the oscillator 1 of each of the embodiments or the oscillator 1 of each of the modified examples as the oscillator 410, a moving object with high reliability can be realized.

As the moving object 400, various types of moving objects are considered. For example, examples thereof include an automobile (including an electric automobile), aircraft such as a jet or a helicopter, a ship, a rocket, and an artificial satellite.

The invention is not limited to the embodiments, and various modifications can be implemented within the scope of the gist of the invention.

The embodiments and modified examples described above are illustrative only, and the invention is not limited to them. For example, the embodiments and modified examples can be appropriately combined together.

The invention includes a configuration (e.g., a configuration having the same function, method, and result, or a configuration having the same advantage and advantageous effect) that is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

What is claimed is:

1. An oscillator comprising:
    a control voltage generator that generates a control voltage between a first reference voltage and a second reference voltage with a digital signal; and
    a voltage controlled oscillation circuit that outputs a signal at a frequency in response to the control voltage, wherein
    the control voltage generator includes a first D/A conversion circuit of resistor voltage-dividing type that generates a voltage between the first reference voltage and the second reference voltage; and
    a second D/A conversion circuit that generates the control voltage from the voltage generated by the first D/A conversion circuit; wherein
    the first D/A conversion circuit is controlled by a high-order m-bit of the digital signal, and
    the second conversion circuit is controlled by a low-order n-bit of the digital signal.

2. The oscillator according to claim 1, wherein
    the second D/A conversion circuit is of the resistor voltage-dividing type.

3. The oscillator according to claim 1, further comprising an operational amplifier that receives the voltage generated by the first D/A conversion circuit and outputs the voltage to the second D/A conversion circuit.

4. The oscillator according to claim 1, wherein
    the number of bits of the digital signal is 12 or more.

5. The oscillator according to claim 1, further comprising a thermosensor, wherein
    the digital signal is a signal based on a signal output from the thermosensor and used for adjusting a frequency of the voltage controlled oscillation circuit.

6. An electronic apparatus comprising the oscillator according to claim 1.

7. An electronic apparatus comprising the oscillator according to claim 2.

8. An electronic apparatus comprising the oscillator according to claim 3.

9. An electronic apparatus comprising the oscillator according to claim 4.

10. An electronic apparatus comprising the oscillator according to claim 5.

11. A moving object comprising the oscillator according to claim 1.

12. A moving object comprising the oscillator according to claim 2.

13. A moving object comprising the oscillator according to claim 3.

14. A moving object comprising the oscillator according to claim 4.

15. A moving object comprising the oscillator according to claim 5.

* * * * *